United States Patent [19]

Sakurai et al.

[11] 4,038,078
[45] July 26, 1977

[54] PROCESS USING SUCTION TO FORM RELIEF IMAGES

[75] Inventors: Kiyomi Sakurai, Neyagawa; Yasuyuki Takimoto, Takatsuki, both of Japan

[73] Assignee: Nippon Paint Co., Ltd., Osaka, Japan

[21] Appl. No.: 599,930

[22] Filed: July 28, 1975

[30] Foreign Application Priority Data

Apr. 19, 1975 Japan .................... 50-47641

[51] Int. Cl.$^2$ ................................. G03C 5/00
[52] U.S. Cl. .................... 96/35.1; 96/27 R; 96/48 R; 96/115 P; 427/43; 427/271
[58] Field of Search ............ 96/35, 35.1, 36, 27 R, 96/48 R; 427/43, 271; 134/21

[56] References Cited
U.S. PATENT DOCUMENTS

| 3,782,961 | 1/1974 | Takahashi et al. | 96/35.1 |
| 3,801,328 | 4/1974 | Takimoto et al. | 96/35.1 |
| 3,801,638 | 4/1974 | Cerwonka et al. | 96/35.1 |
| 3,806,365 | 4/1974 | Jacob | 134/1 |
| 3,901,705 | 8/1975 | Pazos | 96/35.1 |
| 3,926,640 | 12/1975 | Rosen | 96/35.1 |
| 3,926,643 | 12/1975 | Chang | 96/35.1 |

*Primary Examiner*—Jack P. Brammer
*Attorney, Agent, or Firm*—Cook, Wetzel & Egan, Ltd.

[57] ABSTRACT

A process for formation of a relief image which comprises exposing a layer of a photosensitive composition in liquid provided on the surface of a support material to light through a negative to make cured the photosensitive composition at the exposed part and eliminating the non-cured photosensitive composition at the non-exposed part by suctioning for development, the photosensitive composition comprising as the essential components only (1) at least one addition polymerizable unsaturated monomer having at least one acryloyl or methacryloyl group per each molecule and a molecular weight of not more than about 1000 per each acryloyl or methacryloyl group and (2) at least one photopolymerization initiator.

8 Claims, No Drawings

PROCESS USING SUCTION TO FORM RELIEF IMAGES

The present invention relates to a photosensitive composition and its use. More particularly, it relates to a liquid photosensitive composition and a process for forming a relief image using the same.

Liquid photosensitive compositions heretofore used for formation of a relief image comprise usually a polymeric material (e.g. an unsaturated polyester resin obtained by polycondensation of a polyvalent alcohol with an unsaturated carboxylic acid, an acrylated urethane resin obtained by reaction of an isocyanate compound with a hydroxyl groupcontaining acrylic ester), a vinylic monomer (e.g. styrene, methyl methacrylate, butyl methacrylate, acrylamide, methacrylamide, glycidyl methacrylate, triethylene glycol methacrylate) as a cross-linking agent and a photopolymerization initiator (e.g. benzoin, benzoin lower alkyl ether, benzyl, diacetyl) [cf. British Pat. No. 1,131,617].

For formation of a relief image, a photosensitive composition in liquid is filled up in a frame and exposed to light through a negative, followed by elimination of the non-cured photosensitive composition at the non-exposed part for development. The elimination of the non-cured photosensitive composition can be accomplished by various procedures such as washing out with water or any other appropriate liquid material, application of an ultrasonic wave in an appropriate liquid medium or blowing off with compressed air. Among them, the blowing off procedure is particularly advantageous, because it does not require water or any other liquid material for development and therefore not produce any waste liquor, which may cause an environmental pollution problem. For instance, compressed air of about 2 to 3 kg/cm$^2$ is blown to the surface of the photosensitive composition through a slit of about 0.3 mm wide, whereby the non-cured photosensitive composition is eliminated. Since, however, conventional liquid photosensitive compositions usually have a relatively high viscosity, the elimination is sometimes accomplished difficulty and incompletely. Further, an expensive apparatus of relatively large scale is required for preventing the spread of the non-cured photosensitive composition as blown off. Moreover, it is very difficult to achieve a sufficient recovery of the non-cured photosensitive composition and subject the same to repeated use.

According to the present invention, there is provided a photosensitive composition in liquid which comprises as the essential components only at least one addition polymerization unsaturated monomer and at least one photopolymerization initiator. Such liquid photosensitive composition has a relatively low viscosity so that, after exposure, the non-cured one can be readily and completely eliminated, particularly by suction. Thus, the development of the photosensitive composition and the recovery of the non-cured one can be achieved easily with a simple apparatus of small scale.

Different from conventional liquid photosensitive compositions, the photosensitive composition of the invention does not contain any unsaturated polymeric material.

The addition polymerizable unsaturated monomer to be used as one of the essential components in the photosensitive composition of the invention should have at least one acrylolyl or methacryloyl group per each molecule and a molecular weight of not more than about 1000 per each acryloyl or methacryloyl group. The number of acryloyl and/or methacryloyl groups per each molecule may be usually from 1 to 4, preferably from 1 to 3. The molecular weight per each acryloyl or methacryloyl group may be from 72 to 1,000, preferably from 100 to 500. The viscosity of such monomer at room temperature is usually not more than about 500 cps and particularly from 5 to 500 cps.

Specific examples of the addition polymerizable unsaturated monomer are $C_7$–$C_{20}$ alkyl acrylate or methacrylate (e.g. 2-ethylhexyl acrylate, 2-ethyhexyl methacrylate, octyl acrylate, octyl methacrylate, lauryl acrylate, lauryl methacrylate, stearyl acrylate, stearyl methacrylate), poly($C_2$–$C_3$) alkylene glycol diacrylate or dimethacrylate having 9 to 14 alkylene glycol units (e.g. polyethylene glycol diacrylate, polyethylene glycol dimethacrylate, polypropylene glycol diacrylate, polypropylene glycol dimethacrylate), $C_1$–$C_3$ alkoxypoly($C_2$–$C_3$)alkylene glycol acrylate or methacrylate having 9 to 14 alkylene glycol units (e.g. methoxypolyethylene glycol acrylate, methoxypolyethylene glycol methacrylate, ethoxypolyethylene glycol acrylate, ethoxypolyethylene glycol methacrylate), hydroxy($C_2$–$C_3$)alkyl acrylate or methacrylate (e.g. 2-hydroxyethyl acrylate, 2-hydroxyethyl methacrylate, 2-hydroxypropyl acrylate, 2-hydroxypropyl methacrylate), monoacryloyloxy($C_2$–$C_3$)alkyl or monomethacryloyloxy($C_2$–$C_3$)-alkyl phthalate (e.g. 2-acryloyloxyethyl phthalate, 2-methacryloyloxyethyl phthalate, 2-acryloyloxypropyl phthalate), hydroxy($C_2$–$C_3$)alkyl acryloyloxy($C_2$–$C_3$)alkyl or methacryloyloxy($C_2$–$C_3$)alkyl phthalate (e.g. 2-hydroxyethyl 2-acryloyloxyethyl phthalate, 2-hydroxyethyl 2-methacryloyloxyethyl phthalate), etc. Among them, particularly preferred are monoacryloyloxy($C_2$–$C_3$)alkyl phthalate, monomethacryloyloxy($C_2$–$C_3$)alkyl phthalate, hydroxy($C_2$–$C_3$)alkyl acryloyloxy($C_2$–$C_3$)alkyl phthalate and hydroxy($C_2$–$C_3$)alkyl methacryloyloxy($C_2$–$C_3$)alkyl phthalate. These addition polymerizable unsaturated monomers may be used alone or in combination.

The photopolymerization initiator as the other essential component may be, for instance, benzoins (e.g. benzoin, benzoin methyl ether, benzoin ethyl ether, benzoin isopropyl ether, benzoin butyl ether, benzoin octyl ether), acetophenones (e.g. acetophenone, 4-methylacetophenone, ω-bromoacetophenone), azo compounds (e.g. azobisisobutyronitrile, 2,2'-azobis(2-amidinopropane) hydrochloride, 2-phenylazo-2,4-dimethyl-4-methoxyvaleronitrile, 2-amino-2-propylazoformamide), etc. Among them, particularly preferred are benzoin and its $C_1$–$C_{10}$ alkyl ethers. These photopolymerization initiators may be used alone or in combination.

In the photosensitive composition of the invention, the amount of the photopolymerization initiator may be usually from about 0.1 to 10 parts by weight, preferably from about 0.5 to 5.0 parts by weight, to 100 parts by weight of the addition polymerizable unsaturated monomer.

When desired, a plasticizer may be incorporated into the photosensitive composition so as to lower the glass transition temperature of the relief image formed with such composition. As the plasticizer, there may be used the one conventionally employed for plastics, preferably having a viscosity of not more than about 100 cps at room temperature. Specific examples of the plasticizer are dimethyl phthalate, diethyl phthalate, dibutyl phthalate, dioctyl phthalate, di-2-ethylhexyl phthalate, diisodecyl phthalate, diheptyl phthalate, dinonyl phthalate, di-2-ethylhexyl adipate, diisodecyl adipate, di-2-ethylhexyl tetrahydrophthalate, di-n-octyl tetrahydrophthalate, diisodecyl tetrahydrophthalate, glycerol triacetate, glycol tributyrate, etc. The amount of the plasticizer may be usually not more than about 50 parts by weight, preferably from about 5 to 30 parts by weight, to 100 parts by weight of the combined amount of the addition polymerizable unsaturated monomer and the photopolymerization initiator.

Further, an organic amine such as triethylene tetramine, hexamethylene diamine, diethylene triamine, tetraethylene pentamine, pentaethylene hexamine, dimethylaminopropylamine, aminoethylethanolamine or monoethanolamine may be incorporated into the photosensitive composition for enhancing the photosensitivity. The amount of the organic amine may be from about 0.1 to 5 parts by weight to 1 part by weight of the photopolymerization initiator Moreover, any other additive may be incorporated into the photosensitive composition depending on the necessity. For instance, a dyestuff (e.g. Eosine, Rose Bengal, Methyl Violet, Methylene Blue, Malachite Green) may be incorporated for control of the photosensitivity, improvement of the wave length selectivity, prevention of the halation and the like. Further, for instance, a polymerization or oxidation inhibitor such as hydroquinone, p-methoxyphenol, t-butylcatechol or 2,6-di-t-butyl-p-cresol may be incorporated.

The formation of a relief image by the use of the photosensitive composition may be carried out in a conventional manner.

Usually, the photosensitive composition is filled in a frame placed on a support material to make a layer, and light is applied thereto through a negative for exposure, whereby the photosensitive composition at the exposed part is cured. Then, the non-cured photosensitive composition at the non-exposed part is eliminated by suctioning for development to remain a relief image.

As the support material, there may be used a metal plate (e.g. iron plate, aluminum plate), a plastic sheet (e.g. polyester sheet, polyethylene sheet, polypropylene sheet, polyvinyl chloride sheet) or the like. The surface of the support material is preferred to be sanded prior to its use.

The negative, usually supported on a transparent material such as a transparent glass plate or a transparent plastic sheet, may be brought into close contact to or kept with a certain distance from the layer of the photosensitive composition. When brought into close contact, the presence of a cover sheet such as a plastic sheet between the photosensitive composition layer and the negative is preferred.

Illustrating a typical example of the operation for formation of a relief image, a frame of about 0.6 mm in thickness is placed on a polyester sheet, as the support material, having a surface as previously sanded and filled up with the photosensitive composition. The photosensitive composition layer is covered by a transparent polyester sheet of about 6 to 25 microns in thickness as the cover sheet. A transparent glass plate of about 2 mm in thickness having a negative sticked on one surface is pressed on the surface of the photosensitive composition layer to make about 0.6 mm the thickness of such layer. In this case, the glass plate is so placed as to ensure the close contact of the negative on the cover sheet. Alternatively, a negative supported on a transparent glass plate may be kept above and in parallel to the surface of the photosensitive composition layer with a distance of about 0.2 to 0.5 mm. Then, irradiation is made by the use of a high pressure mercury lamp thereon from the upper direction for exposure. The glass plate with the negative and, when used, the cover sheet are taken off, whereby a cured part and a non-cured part are remained on the support material.

The development after exposure and curing can be effected in the same manner as applied to conventional liquid photosensitive compositions to form a relief image. But, it is the most preferred to carry out the development by suctioning the non-cured photosensitive composition of non-exposed part so as to remain the cured photosensitive composition at the exposed part. When sticking is left on the surface of the resulting relief image, wiping with a cloth or a paper or washing with water may be performed as an additional or supplemental measure. For the suctioning, any conventional machine having an appropriate suction power may be used. For instance, the photosensitive composition having a viscosity of about 500 cps may be suctioned by the use of a vacuum cleaner having a suction amount of about 2.5 $m^3$ per minute.

The photosensitive composition suctioned by a suctioning machine is recovered in an appropriate vessel equipped in such machine. The recovered photosensitive composition is substantially unchanged from the one before the use and can be used again for the formation of a relief image under the same condition as explained above.

The photosensitive composition of the invention is greatly advantageous in making it possible to develop by suctioning. Thus, the non-cured photosensitive composition can be easily recovered without any material change and used with repetition.

Practical and presently preferred embodiments of the invention are illustratively shown in the following Examples wherein parts are by weight.

EXAMPLE 1

2-Hydroxypropyl 2-acryloyloxypropyl phthalate (100 parts) and benzoin isopropyl ether (2 parts) are mixed well to make a photosensitive composition having a viscosity of 140 cps at 20° C. On the sanded surface of a polyester sheet of 0.1 mm thick sticked on a transparent glass plate of 5 mm thick, a frame of 0.6 mm thick is placed and filled up with the photosensitive composition. The photosensitive composition layer is covered by a transparent polyester sheet of 0.009 mm thick as a cover sheet and pressed by a negative adhered on a transparent glass plate of 3 mm thick to make the thickness of the photosensitive composition 0.6 mm. Irradiation is made by the use of a high pressure mercury lamp of 3 KW at a distance of 70 cm for 2 minutes, whereby exposure is completed. After the glass plate with the negative and the cover sheet are taken off, the non-cured photosensitive composition of the non-exposed part is suctioned by the use of an industrial vacuum suctioning machine having a suction amount of about 2.6 $m^3$ and a round suction area of 3.5 cm in diameter for about 2 minutes, whereby development is completed. The thus obtained releif image is constituted with a resin having a tensile strength of about 100 $kg/cm^2$.

EXAMPLE 2

2-Acryloyloxyethyl phthalate (70 parts), 2-hydroxypropyl 2-acryloyloxypropyl phthalate (30 parts) and benzoin isopropyl ether (2 parts) are mixed well to make a photosensitive composition having a viscosity of 310 cps at 20° C. On the sanded surface of a polyester sheet of 0.1 mm thick sticked on a transparent glass plate of 5 mm thick, a frame of 0.6 mm thick is placed and filled up with the photosensitive composition. A negative adhered on the transparent glass plate of 3 mm is kept above the photosensitive composition layer at a distance of about 0.3 mm. Irradiation is made by the use of a high pressure mercury lamp of 3 KW from the upper part at a distance of 1 m for 5 minutes, whereby exposure is completed. After the glass plate with the negative is taken off, the non-cured photosensitive composition of the non-exposed part is suctioned by the use of an industrial vacuum suctioning machine as used in Example 1, whereby development is completed. The thus obtained relief image is constituted with a resin having a tensile strength of about 20 kg/cm$^2$.

EXAMPLE 3

Methoxyanonaethyleneglycol methacrylate (30 parts), 1-hydroxyethyl methacrylate (70 parts) and benzoin isopropyl ether (3 parts) are mixed well to make a photosensitive composition having a viscosity of 16 cps at 20° C. Using the photosensitive composition, operation is carried out as in Example 1 to give a relief image.

EXAMPLE 4

2-Hydroxyethyl methacrylate (50 parts), 2-ethylhexyl methacrylate (50 parts) and benzoin isopropyl ether (3 parts) are mixed well to make a photosensitive composition having a viscosity of 60 cps at 20° C. Using the photosensitive composition, operation is carried out as in Example 2 to give a relief image.

EXAMPLE 5

Using the non-cured photosensitive composition recovered by suctioning in Example 1, operation is carried out as in Example 1 to give a relief image, wbhich has the substantially same properties as those of the relief image obtained in Example 1.

What is claimed is:

1. A process for formation of a relief image which comprises exposing a portion of a layer of a photosensitive composition provided on the surface of a support material to light through a negative to cure the exposed portion of the photosensitive composition and thereafter developing the image by eliminating the unexposed uncured photosensitive composition by suction, the photosensitive composition being a liquid composition containing no unsaturated polymeric material and having at least one addition polymerizable unsaturated monomer selected from the group consisting of $C_7$—$C_{20}$ alkyl acrylates and methacrylates, poly($C_2$-$C_3$) alkylene glycol diacrylates and dimethacrylates having 9 to 14 alkylene glycol units, $C_1$-$C_3$ alkoxypoly($C_2$-$C_3$) alkylene glycol acrylates and methacrylates having 9 to 14 alkylene glycol units, hydroxy ($C_2$-$C_3$) alkyl acrylates and methacrylates, monoacryloyloxy ($C_2$-$C_3$) alkyl and monomethacryloyloxy($C_2$-$C_3$) alkyl phthalates, and hydroxy($C_2$-$C_3$) alkyl acryloyloxy($C_2$-$C_3$) alkyl and methacryloyloxy($C_2$-$C_3$)alkyl phthalates and at least one photopolymerization initiator, the initiator being present in an amount effective to photopolymerize the unsatuated monomer when the photosensitive composition is exposed to light.

2. The process according to claim 1, wherein the amount of the photopolymerization initiator in the photosensitive composition is from about 0.1 to 10 parts by weight per 100 parts by weight of the addition polymerizable unsaturated monomer.

3. The process according to claim 1, wherein the amount of the photopolymerization initiator in the photosensitive composition is from about 0.5 to 5 parts by weight per 100 parts by weight of the addition polymerizable unsaturated monomer.

4. The process according to claim 1, wherein the addition polymerizable unsaturated monomer in the photosensitive composition is monoacryloyloxy($C_2$-$C_3$)alkyl phthalate, monomethacryloyloxy($C_2$-$C_3$)alkyl phthalate, hydroxy($C_2$-$C_3$alkyl acryloyloxy($C_2$-$C_3$)alkyl phthalate or hydroxy($C_2$-$C_3$)alkyl methacryloyloxy($C_2$-$C_3$)alkyl phthalate.

5. The process according to claim 1, wherin the photopolymerization initiator in the photosensitive composition is benzoins, acetophenones or azo compounds.

6. The process according to claim 5, wherein the photopolymerization initiator in the photosensitive composition is benzoin or its $C_1$-$C_{10}$ alkyl ether.

7. The process according to claim 1, wherein the photosensitive composition also includes a plasticizer in an amount of not more than about 50 parts by weight per 100 parts by weight of the combined amount of the addition polymerizable unsaturated monomer and the photopolymerization initiator.

8. The process according to claim 1, wherein the photosensitive composition also includes an organic amine in an amount of about 0.1 to 5 parts by weight to 1 part by weight of the photopolymerization initiator.

* * * * *

UNITED STATES PATENT OFFICE
CERTIFICATE OF CORRECTION

PATENT NO. : 4,038,078
DATED : July 26, 1977
INVENTOR(S) : Kiyomi Sakurai and Yasuyuki Takimoto It is certified that error appears in the above-identified patent and that said Letters Patent are hereby corrected as shown below:

Column 1, line 15, the word "groupcontaining" should read --group-containing--.

line 43, the word "difficulty" should read --difficultly--.

line 68, the word "acrylolyl" should read --acryloyl--.

Column 2, line 19, the word "c_2" should read --$C_2$--.

Column 5, line 26, in (Example 3), the word "1-hydroxyethyl" should read --2-hydroxyethyl--.

line 43, in (Example 5), the word "wbhich" should read --which--.

Column 6, line 33, in Claim 4, the word "hydroxy ($C_2 - C_3$ alkyl" should read --hydroxy ($C_2 - C_3$) alkyl--.

line 36, in Claim 5, the word "wherin" should read --wherein--.

Signed and Sealed this

Twenty-second Day of January 1980

[SEAL]

Attest:

SIDNEY A. DIAMOND

Attesting Officer          Commissioner of Patents and Trademarks